US011889663B1

(12) United States Patent
Liu et al.

(10) Patent No.: US 11,889,663 B1
(45) Date of Patent: Jan. 30, 2024

(54) IMMERSION DUAL-CYCLE MULTI-MODE LIQUID COOLING REGULATION SYSTEM AND METHOD FOR DATA CENTER

(71) Applicant: SOUTHEAST UNIVERSITY, Nanjing (CN)

(72) Inventors: Xu Liu, Nanjing (CN); Ao Li, Nanjing (CN); Jiangfeng Yao, Nanjing (CN); Zilong Deng, Nanjing (CN); Chengbin Zhang, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 18/368,026

(22) Filed: Sep. 14, 2023

Related U.S. Application Data

(63) Continuation of application No. PCT/CN2023/080640, filed on Mar. 9, 2023.

(30) Foreign Application Priority Data

Dec. 7, 2022 (CN) .......................... 202211563962.9

(51) Int. Cl.
*H05K 7/20* (2006.01)

(52) U.S. Cl.
CPC ......... *H05K 7/20818* (2013.01); *H05K 7/203* (2013.01); *H05K 7/20236* (2013.01); *H05K 7/20272* (2013.01); *H05K 7/20327* (2013.01); *H05K 7/20781* (2013.01)

(58) Field of Classification Search
CPC .......... H05K 7/20236; H05K 7/20272; H05K 7/203; H05K 7/20318; H05K 7/20327; H05K 7/208–20818; H05K 7/20781
See application file for complete search history.

(56) References Cited

U.S. PATENT DOCUMENTS

| 2021/0185857 A1 | 6/2021 | Zhong |
| 2023/0156963 A1* | 5/2023 | Liu ..................... H05K 7/20781 361/679.53 |
| 2023/0240051 A1* | 7/2023 | Gao ..................... H05K 7/20818 361/688 |

FOREIGN PATENT DOCUMENTS

| CN | 111465299 A | 7/2020 |
| CN | 112839490 A | 5/2021 |
| CN | 113056167 A | 6/2021 |

(Continued)

*Primary Examiner* — Zachary Pape
(74) *Attorney, Agent, or Firm* — Bayramoglu Law Offices LLC

(57) ABSTRACT

An immersion dual-cycle multi-mode liquid cooling regulation system and method for a data center comprises data center cabinets, a microchannel condensation heat exchanger, a plate heat exchanger, waste heat recovery devices, a cooling water storage tank, a fluorinated liquid storage tank, a liquid pump, a fluorinated liquid, pipelines, and pipeline valves. The system switches between single-phase and two-phase circulation loops according to the working power consumption of a server and the thermophysical property of a cooling working medium, and realizes flexible adjustment and control according to the cooling demand of the cabinet, the load magnitude and the working environment, thus avoiding the waste of resources caused by different loads in the data center; and cooling water flows through the waste heat recovery devices to recover heat, to reduce the electricity consumption of the system and greatly improve the utilization efficiency of cooling capacity.

20 Claims, 4 Drawing Sheets

(56) References Cited

FOREIGN PATENT DOCUMENTS

| | | |
|---|---|---|
| CN | 113093890 A | 7/2021 |
| CN | 115568193 A | 1/2023 |

\* cited by examiner

IMMERSION DUAL-CYCLE MULTI-MODE LIQUID COOLING REGULATION SYSTEM AND METHOD FOR DATA CENTER

CROSS-REFERENCES TO THE RELATED APPLICATIONS

This application is a continuation of International Patent Application No. PCT/CN2023/080640 filed on Mar. 9, 2023, which claims priority based on Chinese patent application 202211563962.9 filed on Dec. 7, 2022, the entire contents of which are incorporated herein by reference.

TECHNICAL FIELD

The invention relates to a cooling system, in particular to an immersion dual-cycle multi-mode liquid cooling regulation system and method for a data center, and belongs to the technical field of server cooling in computer rooms.

BACKGROUND

In light of the rapid evolution of computing-intensive applications, such as Artificial intelligence and the Internet of Things, the ever-increasing demand for computational power has compelled data centers to strive for "high performance, high density, and high energy consumption." Nonetheless, this intensified heat production jeopardizes the stability of servers. Consequently, it becomes crucial to devise a cooling system for data center cabinets that can effectively cater to the heightened cooling requirements of larger servers.

Common server cooling systems typically employ air cooling and liquid cooling methods. Immersion liquid cooling, in particular, stands out as it offers the highest heat transfer efficiency and effectively mitigates the occurrence of local hot spots. This makes it the most promising technical solution for resolving the numerous challenges encountered by cooling systems in a high-performance computing environment.

A coolant is key to the immersion liquid cooling technology. Electronic fluorinated liquids are typically employed as coolants in current immersion liquid cooling equipment of servers. However, due to variations in thermophysical properties and insulation characteristics, different coolants are suitable for different application scenarios and liquid cooling technologies. For instance, Novec7000 and HFE-7100, two common electronic fluorinated liquids used in immersion liquid cooling, exhibit a considerable boiling point difference of nearly 30° C. under standard atmospheric pressure. The choice of electronic fluorinated liquids significantly impacts the overall performance of an immersion cooling system. Thus, ensuring a compatible match between an electronic fluorinated liquid and an immersion liquid cooling system of a server is crucial for achieving efficient cooling.

The cooling requirements of a data center, aside from powering IT equipment, contribute significantly to its overall power consumption. Thus, finding energy-efficient solutions to address the cooling challenge of the data center becomes crucial in reducing the power usage effectiveness (PUE). As the workload of servers fluctuates greatly, it becomes essential to develop a cooling system for a cabinet that can dynamically and flexibly allocate cooling capacity based on server workload. By adapting and converting modes according to server load, this approach can effectively align the cooling efficiency of the cabinet with the cooling requirements of the server. Ultimately, energy consumption of the cooling system for the cabinet and cooling capacity waste can be minimized when servers operate at low loads.

In the current cooling schemes of data center cabinets, one common approach is to switch between cooling modes based on cooling requirements, aiming to minimize energy consumption. Despite this, the transition between air cooling and single-phase heat pipe cooling proves challenging when meeting the cooling demands of high-load data centers. Another limitation is the small contact area between heat pipes and servers, resulting in excessive thermal stress caused by uneven distribution of server hot spots during high workload operations.

Based on the aforementioned circumstances, there is a pressing requirement for an adaptable cooling system in existing data center cabinets. This system must be capable of accommodating diverse specifications of fluorinated liquids and transitioning cooling modes in response to fluctuations in the load of data center servers. The ultimate goal is to guarantee a high cooling efficiency and minimize overall cooling energy consumption within the system.

SUMMARY

Technical problem: Aiming at the shortcomings of existing data center cabinet cooling systems, the invention provides an immersion dual-cycle multi-mode liquid cooling regulation system and method for a data center, which not only adapt to electronic fluorinated liquids with varying specifications but also adjust the cooling mode based on server load, enabling flexible distribution of cooling capacity and reducing energy consumption.

Technical scheme: The immersion dual-cycle multi-mode liquid cooling regulation system for a data center in the invention comprises a data center cabinet array, a microchannel condensation heat exchanger, a plate heat exchanger, a first waste heat recovery device, a second waste heat recovery device, a fluorinated liquid storage tank, a second cooling water drive pump, a cooling water storage tank, a fluorinated liquid drive pump, a first cooling water drive pump, an external back-clip fan, a single-phase loop cooling water valve and a two-phase loop cooling water valve, wherein the data center cabinet array consists of a plurality of data center cabinets, the data center cabinets are connected with the plate heat exchanger (4) through a fluorinated liquid outlet pipeline, an outlet end of the plate heat exchanger is connected with a fluorinated liquid storage tank through the fluorinated liquid drive pump and a fluorinated liquid outlet pipeline valve, an upper part of the data center cabinet is connected with the microchannel condensation heat exchanger through a fluorinated liquid vapor outlet pipeline, a middle part of the data center cabinet communicates with the fluorinated liquid storage tank, and an upper part of the fluorinated liquid storage tank communicates with the microchannel condensation heat exchanger, thereby forming a working loop of a fluorinated liquid;

an upper part of the cooling water storage tank returns to a lower part of the cooling water storage tank through the two-phase loop cooling water valve, the first cooling water drive pump, the microchannel condensation heat exchanger and the first waste heat recovery device in sequence, thereby forming a working loop of cooling water; in addition, a middle part of the cooling water storage tank returns to the cooling water storage tank through the second waste heat recovery device, the second cooling water drive pump, the plate heat exchanger and the single-phase loop cooling water valve, thereby forming a second working loop of the cooling water; and the circulation of the cooling water and the circulation of the cooling fluorinated liquid are independent of each other, solely serving the purpose of heat exchange therebetween.

The data center cabinet array comprises a plurality of data center cabinets, fluorinated liquid cooling systems of the data center cabinets are connected in parallel to ensure the communication of all areas, a blade server is fixed inside the data center cabinets and completely immersed in the fluorinated liquid, and a liquid surface in the data center cabinet is reserved with enough space for phase change of the fluorinated liquid.

A surface area of the data center cabinet is partially made of a transparent interface material with low thermal resistance, allowing for observation of the working condition of the blade server inside the cabinet and checking of the adequacy of the fluorinated liquid remaining; further, an air pressure sensor, a liquid level sensor and a temperature sensor are arranged inside the data center cabinet.

The upper part of the data center cabinet is connected with the microchannel condensation heat exchanger through the fluorinated liquid vapor outlet pipeline, that is, a fluorinated liquid vapor outlet is connected with a working medium inlet of the microchannel condensation heat exchanger, and a working medium outlet of the microchannel condensation heat exchanger is connected with the fluorinated liquid storage tank, that is, fluorinated liquid vapor flows back to the fluorinated liquid storage tank after condensation and heat exchange in the microchannel condensation heat exchanger, thus forming a fluorinated liquid two-phase circulation loop; and a bottom of the data center cabinet is provided with the fluorinated liquid outlet pipeline, the fluorinated liquid outlet pipeline is connected with a condensation inlet of the plate heat exchanger, and the low-temperature fluorinated liquid flows back into the fluorinated liquid storage tank under the action of the fluorinated liquid drive pump after exchanging heat with the cooling water, thus forming a fluorinated liquid single-phase circulation loop.

The cooling water is deionized distilled water; for single-phase circulation, an electronic fluorinated liquid Fluorinert FC-3283 featuring a high boiling point, a wide liquid range, a narrow boiling range and good thermal stability is adopted as the fluorinated liquid; for two-phase circulation and a compound working mode, an electronic fluorinated liquid Novec71DA featuring a low boiling point and a wide boiling range is adopted as the fluorinated liquid; and by adjusting the opening and closing degrees of the fluorinated liquid outlet pipeline valve, a fluorinated liquid vapor pressure relief valve and a cooling capacity control valve, all cabinets within the data center cabinet array receive appropriate cooling capacity.

The fluorinated liquid outlet pipeline is an enhanced heat transfer pipeline with an inner fin structure and has high thermal conductivity; and the microchannel condensation heat exchanger is equipped with an external back-clip fan, and cooling efficiency is further improved by the convection created by the external back-clip fan.

The microchannel condensation heat exchanger, the data center cabinet array, the fluorinated liquid storage tank and the plate heat exchanger are arranged in descending order of height.

A first immersion dual-cycle multi-mode liquid cooling regulation method of the regulation system in the invention is as follows: when the dual-cycle multi-mode liquid cooling regulation system only works in the single-phase circulation loop, the fluorinated liquid vapor pressure relief valve, the two-phase loop cooling water valve and the first cooling water drive pump are closed, the fluorinated liquid outlet pipeline valve is opened, and the fluorinated liquid outlet pipeline is opened; when a cold source of the whole cycle is low-temperature cold air where the data center cabinet is located, the single-phase loop cooling water valve is closed, the system works in an environmental cooling mode, and the fluorinated liquid flows into the plate heat exchanger under gravity, and transfers heat to external cold air in the flowing process; when the cold source of the whole cycle is low-temperature cooling water, the single-phase loop cooling water valve is opened, the system works in a single-phase cooling mode, the cooling water in the cooling water storage tank automatically flows into the plate heat exchanger under gravity, the cooling water and the high-temperature fluorinated liquid exchange heat in the plate heat exchanger, and the cooling water receiving heat through the plate heat exchanger flows through the second waste heat recovery device to recover heat and then is pumped into the cooling water storage tank to complete a cooling water single-phase cooling cycle; and the fluorinated liquid outlet pipeline of the plate heat exchanger is connected with the fluorinated liquid storage tank, and the cooled fluorinated liquid is propelled by the fluorinated liquid drive pump and flows back into the fluorinated liquid storage tank to replenish the supply of fluorinated liquid in the data center cabinet.

A second immersion dual-cycle multi-mode liquid cooling regulation method of the regulation system in the invention is as follows: when the dual-cycle multi-mode liquid cooling regulation system only works in the two-phase circulation loop, the fluorinated liquid outlet pipeline valve, the single-phase loop cooling water valve and the second cooling water drive pump are closed, the fluorinated liquid vapor pressure relief valve and the two-phase loop cooling water valve are opened, and fluorinated liquid vapor sends the fluorinated liquid to the microchannel condensation heat exchanger through a vapor inlet due to a pressure difference; at the same time, the cooling water enters a cooling water pipeline at an upper part of the microchannel condensation heat exchanger under the action of the first cooling water drive pump and is diverted through a microchannel with rhombic micro-cooling columns inside moreover, the fluorinated liquid vapor is liquefied and condensed at a diamond interface to release heat, liquid droplets, after absorbing heat, coalesce and flow into the cooling water storage tank under the driving of gravity through the first waste heat recovery device, and the fluorinated liquid flows back into the fluorinated liquid storage tank under gravity.

A third immersion dual-cycle multi-mode liquid cooling regulation method of the regulation system in the invention is as follows: when the dual-cycle multi-mode liquid cooling regulation system works in a compound cooling mode, that is, the single-phase circulation loop and the two-phase circulation loop are both enabled, the single-phase loop cooling water valve, the two-phase loop cooling water valve, the fluorinated liquid vapor pressure relief valve, the first cooling water drive pump, the second cooling water drive pump and the fluorinated liquid outlet pipeline valve are all opened, a liquid phase area of the fluorinated liquid in the cabinet enters the single-phase circulation loop, and a gas phase area of the fluorinated liquid enters the two-phase circulation loop, to achieve the highest cooling efficiency.

Beneficial effects: The immersion dual-cycle multi-mode liquid cooling regulation system and method for a data center in the invention have the following advantages.

First, the data center cabinets in the invention communicate with each other through pipelines and pipeline valves, and a certain transparent area is reserved for observing the working condition of the server inside and checking the adequacy of the fluorinated liquid remaining, to facilitate the replenishment of the fluorinated liquid and cabinet maintenance.

Second, the invention has a self-adaptive switching ability according to the thermophysical properties of different electronic fluorinated liquids, ensuring optimal compatibility between the electronic fluorinated liquid and the cooling system.

Third, according to the different loads of the data center cabinets and the working environment of equipment, the invention designs four working modes involving the two-phase circulation loop and the single-phase circulation loop, enabling the selection of an optimal mode that guarantees a highly efficient cooling effect while minimizing the PUE of the data center.

Fourth, the invention controls each pipeline valve according to the detection data of the sensors in the data center cabinets, to achieve flexible switching between modes and ensure a reasonable allocation of cooling capacity across all cabinets.

Figure 1:
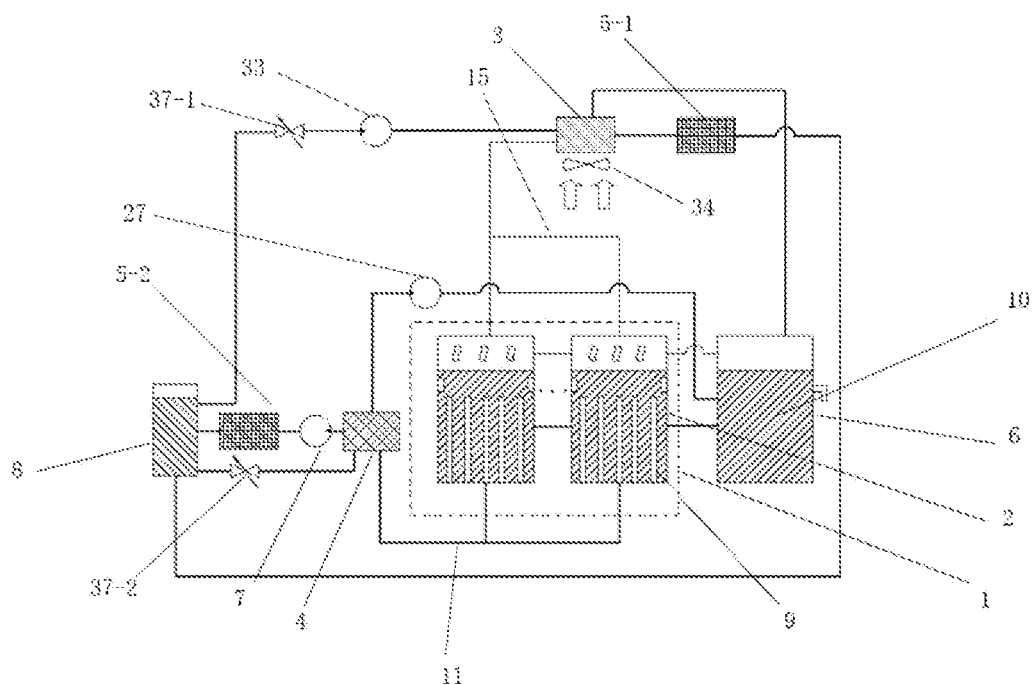
FIG. 1 is a structural diagram of a system in the invention.

Included in the figures are: data center cabinet array 1, data center cabinet 2, microchannel condensation heat exchanger 3, plate heat exchanger 4, first waste heat recovery device 5-1, second waste heat recovery device 5-2, fluorinated liquid storage tank 6, second cooling water drive pump 7, cooling water storage tank 8, blade server 9, fluorinated liquid 10, fluorinated liquid outlet pipeline 11, condensed fluorinated liquid return pipeline 12, cooling water inlet pipeline 13, cooling water outlet pipeline 14, fluorinated liquid vapor outlet pipeline 15, standby cabinet maintenance pipeline 16, air pressure sensor 17, temperature sensor 18, liquid level sensor 19, blade server fixing slide rail 20, blade server fixing baffle 21, cabinet communication liquid pipeline 22, cabinet communication gas manifold 23, microchannel heat sink 24, super-hydrophobic copper nano-cone structure 25, microchannel cooling water inlet 26, fluorinated liquid drive pump 27, cabinet communication liquid pipeline valve 28, cooling capacity control valve 29, cabinet communication gas pipeline valve 30, fluorinated liquid vapor pressure relief valve 31, server cabinet housing 32, first cooling water drive pump 33, external back-clip fan 34, fluorinated liquid outlet pipeline valve 35, transparent window 36, two-phase loop cooling water valve 37-1, single-phase loop cooling water valve 37-2, rhombic microcooling column 38, condensation chamber 39, microchannel cooling water outlet 40 and rhombic groove 41.

DETAILED DESCRIPTION OF THE EMBODIMENTS

An immersion dual-cycle multi-mode liquid cooling regulation system and method for a data center in the invention will be further described in detail with the attached drawings.

As shown in FIG. 1, the regulation system comprises a data center cabinet array 1, a microchannel condensation heat exchanger 3, a plate heat exchanger 4, a first waste heat recovery device 5-1, a second waste heat recovery device 5-2, a fluorinated liquid storage tank 6, a second cooling water drive pump 7, a cooling water storage tank 8, a fluorinated liquid drive pump 27, a first cooling water drive pump 33, an external back-clip fan 34, a single-phase loop cooling water valve 37-2 and a two-phase loop cooling water valve 37-1, wherein the data center cabinet array 1 consists of a plurality of data center cabinets 2, the data center cabinets 2 are connected with the plate heat exchanger 4 through a fluorinated liquid outlet pipeline 11, an outlet end of the plate heat exchanger 4 is connected with a fluorinated liquid storage tank 6 through the fluorinated liquid drive pump 27 and a fluorinated liquid outlet pipeline valve 35, an upper part of the data center cabinet 2 is connected with the microchannel condensation heat exchanger 3 through a fluorinated liquid vapor outlet pipeline 15, a middle part of the data center cabinet 2 communicates with the fluorinated liquid storage tank b, and an upper part of the fluorinated liquid storage tank 6 communicates with the microchannel condensation heat exchanger 3, thereby forming a working loop of a fluorinated liquid;

an upper part of the cooling water storage tank 8 returns to a lower part of the cooling water storage tank 8 through the two-phase loop cooling water valve 37-1, the first cooling water drive pump 33, the microchannel condensation heat exchanger 3 and the first waste heat recovery device 5-1 in sequence, thereby forming a working loop of cooling water; in addition, a middle part of the cooling water storage tank 8 returns to the cooling water storage tank 8 through the second waste heat recovery device 5-2, the second cooling water drive pump 7, the plate heat exchanger 4 and the single-phase loop cooling water valve 37-2, thereby forming a second working loop of the cooling water and the circulation of the cooling water and the circulation of the cooling fluorinated liquid are independent of each other, solely serving the purpose of heat exchange therebetween.

The single-phase circulation loop comprises the following components: the fluorinated liquid storage tank 6, the fluorinated liquid drive pump 27, the plate heat exchanger 4, the second waste heat recovery device 5-2, the cooling water storage tank 8, the fluorinated liquid outlet pipeline 11 and the fluorinated liquid outlet pipeline valve 35; the second cooling water drive pump 7, the second waste heat recovery device 5-2, the plate heat exchanger 4, the single-phase loop cooling water valve 37-2 and the cooling water storage tank 8 constitute a second cooling water cycle, which is independent of a cooling cycle of the data center cabinet 2; the plate heat exchanger 4 is placed at a position lower than the data center cabinet 2 and the cooling water storage tank 8 in the horizontal direction; the microchannel condensation heat exchanger 3 is located at a position higher than the cooling water storage tank 8 and the data center cabinet 2 in the horizontal direction; and the fluorinated liquid storage tank 6 is at the same level as the data center cabinet 2 in the horizontal direction. The two-phase circulation loop comprises the microchannel condensation heat exchanger 3, the first waste heat recovery device 5-1, the first cooling water drive pump 33, the cooling water storage tank 8, the fluorinated liquid storage tank 6 and the two-phase loop cooling water valve 37-1; the first cooling water drive pump 33, the two-phase loop cooling water valve 37-1, the microchannel condensation heat exchanger 3 and the first waste heat recovery device 5-1 constitute a first cooling water cycle; and the two-phase loop cooling water valve 37-1 and the single-phase loop cooling water valve 37-2 control the start of the first cooling water cycle and the second cooling water cycle respectively, and the blade server 9 is in a closed state when not working.

The single-phase circulation loop and the two-phase circulation loop can be flexibly enabled according to the operating power consumption of the blade server 9, the thermophysical property of the fluorinated liquid 10 and the ambient temperature of the data center cabinet array 1, and can work in four modes.

When the data center is in a low-load working state, the ambient temperature of the whole data center cabinet array 1 is lower than 20° C., and the boiling point of the fluorinated liquid 10 used in the system is higher than the case temperature of a server chip, the single-phase loop cooling water valve 37-2 and the two-phase loop cooling water valve 37-1 are closed, the system works in the single-phase circulation loop, and the first cooling water cycle and the second cooling water cycle are not enabled, so the system is in an ambient cooling mode. With the continuous heat generation of the blade server 9, the fluorinated liquid vapor pressure relief valve 31 is closed, and the temperature sensor 18 detects that the temperature rises; when the temperature of the fluorinated liquid rises to the case temperature of the chip, since the boiling point of the fluorinated liquid 10 is higher than the case temperature of the chip, the air pressure in the cabinet detected by the air pressure sensor 17 should be kept constant during the temperature rise of the fluorinated liquid 10; at this point, the fluorinated liquid outlet pipeline valve 35 is opened, so that the fluorinated liquid outlet pipeline 11 is opened; moreover, the fluorinated liquid outlet pipeline 11 is an enhanced heat transfer pipeline with an inner fin structure, which has a large heat transfer coefficient and high thermal conductivity; the fluorinated liquid outlet pipeline 11 is connected with a cooling medium inlet of the plate heat exchanger 4, and the fluorinated liquid 10 flows into the plate heat exchanger 4 under gravity, and transfers heat to external cold air in the flowing process; the cooled fluorinated liquid is propelled by the fluorinated liquid drive pump 27 and flows back into the fluorinated liquid storage tank 6 to replenish the supply of fluorinated liquid 10 in the data center cabinet 2 to complete the cycle; and because a old source of the whole cycle is the cold air where the data center cabinet 2 is located, the cycle can be completed with only one liquid pump, and the power consumption of the system is very low.

When the load of the blade server 9 increases, or the ambient temperature of the data center cabinet array 1 is higher than 20° C., the cooling demand of the blade server 9 cannot be met by using indoor air as the sole cold source, and plus, the boiling point of the fluorinated liquid used in the system is higher than the case temperature of the server chip, in this case, the single-phase loop cooling water valve 37-2 is opened, the system still works in the single-phase circulation loop, and only the second cooling water cycle is enabled; the air pressure sensor 17 detects that the air pressure in the cabinet is unchanged during temperature rise of the fluorinated liquid, and at this point, the fluorinated liquid vapor pressure relief valve 31 is closed, to prevent the blade server 9 from overheating and causing the fluorinated liquid 10 to change phase under rising temperature and leak from the fluorinated liquid vapor outlet pipeline 15, so that the system does not enter the two-phase circulation loop; with the continuous accumulation of heat generated by the blade server 9, the temperature of the fluorinated liquid 10 keeps rising; when the temperature of the fluorinated liquid 10 rises to the case temperature of the chip, the fluorinated liquid outlet pipeline valve 35 and the single-phase loop cooling water valve 37-2 are opened; the fluorinated liquid outlet pipeline 11 is connected with the plate heat exchanger 4, the high-temperature fluorinated liquid 10 flows into the fluorinated liquid outlet pipeline 11 and flows into the plate heat exchanger 4 under the driving of gravity, and cooling water in the cooling water storage tank 8 automatically flows into the plate heat exchanger 4 as a cold source under gravity; sensible heat of the fluorinated liquid 10 is utilized to absorb the heat generated by the blade server 9, and then the cooling water and the fluorinated liquid 10 exchange heat in the plate heat exchanger 4; the system works in a single-phase cooling mode, and the cooled fluorinated liquid 10 is pumped into the fluorinated liquid storage tank 6 through the fluorinated liquid drive pump 27 to complete the cooling cycle of the fluorinated liquid 10; the cooling water receiving heat through the plate heat exchanger 4 flows through the second waste heat recovery device 5-2 to recover heat, and then is propelled by the second cooling water drive pump 7 to return to the cooling water storage tank 8 to complete the second cooling water cycle. It is worth noting that with the long-term operation in the single-phase circulation loop, that is, when the system is in an ambient cooling mode or the single-phase cooling mode, the temperature of the data center cabinets 2 will gradually stabilize. According to the temperature of each data center cabinet 2, a cabinet communication liquid pipeline valve 28 is closed at this point, and the opening and closing degree of the fluorinated liquid outlet pipeline valve 35 is controlled, to dynamically regulate the fluorinated liquid outlet flow of each cabinet and ensure the reasonable distribution of cooling capacity of the system.

When the load of the blade server 9 is large, heating power is high, and the boiling point of the fluorinated liquid 10 used is lower than the case temperature of the chip, with the continuous heat generation of the blade server 9, the fluorinated liquid inside the data center cabinet 2 begins to boil before the temperature rises to the case temperature of the chip; at this point, the two-phase circulation loop of the system is enabled, the system works in a two-phase cooling mode, and the blade server 9 is cooled by the gasification latent heat of the fluorinated liquid, thus further improving the cooling efficiency; when the temperature sensor 18 detects that the temperature of the fluorinated liquid in the cabinet rises to the boiling point, as the fluorinated liquid changes from the liquid phase to the gas phase, in the case that the air pressure sensor 17 detects that the air pressure in the cabinet rises to a saturated air pressure, the fluorinated liquid outlet pipeline valve 35 and the single-phase loop cooling water valve 37-2 are closed to prevent the system from entering the single-phase circulation loop, and the fluorinated liquid vapor pressure relief valve 31 and the two-phase loop cooling water valve 37-1 are opened to start the first cooling water cycle; due to the pressure difference between a gas phase area in the cabinet and a condensation chamber 39 in the microchannel condensation heat exchanger 3, fluorinated liquid vapor is driven to the microchannel condensation heat exchanger 3, and fluorinated liquid vapor generated by the boiling phase change of the fluorinated liquid 10 enters the microchannel condensation heat exchanger 3 through the fluorinated liquid vapor outlet pipeline 15 for liquefaction and condensation to release heat; at the same time, the cooling water in the cooling water storage tank 8 flows through the cooling water inlet pipeline 13 and is pumped into the microchannel condensation heat exchanger 3 by the first cooling water drive pump 33, exchanges heat with the fluorinated liquid vapor, and then flows back to the cooling water storage tank 8 under gravity through the cooling water outlet pipeline 14 to complete the cycle; at the same time, the microchannel condensation heat exchanger 3 is also equipped with an external back-clip fan 34, and cooling efficiency is further improved by the convection created by the external back-clip fan 34. Similarly, when the system works in the two-phase circulation loop for a long time, that is, the system works in the two-phase cooling mode, the temperature of the data center cabinets 2 will gradually become stable. According to the temperature of each data center cabinet 2, a cabinet communication gas pipeline valve 30 is closed, the opening and closing degrees of the fluorinated liquid vapor pressure relief valve 31 and the cooling capacity control valve 29 are controlled, and the fluorinated vapor outlet flow of each cabinet and the cooling water flow of the microchannel condensation heat exchanger 3 are dynamically regulated to ensure the reasonable distribution of cooling capacity of the system.

In addition, when the boiling point of the fluorinated liquid 10 is lower than the case temperature of the chip, the single-phase circulation loop and the two-phase circulation loop can be started at the same time, so that the system works in a compound cooling mode to achieve cooling under ultra-high heat flux. Specifically, when the blade server 9 works at full load, the single-phase circulation cooling water valve 37-2 and the two-phase circulation cooling water valve 37-1 are both opened, that is, the first cooling water cycle and the second cooling water cycle are both in a working state; when the temperature sensor 18 detects that the temperature of the fluorinated liquid 10 in the cabinet rises to the boiling point, the air pressure sensor 17 detects that the air pressure in the cabinet keeps rising as the fluorinated liquid continuously changes from the liquid phase to the gas phase; and when the air pressure in the cabinet rises to the saturated air pressure, the fluorinated liquid vapor pressure relief valve 31 and the fluorinated liquid outlet pipeline valve 35 are opened, so that the system works in the single-phase cooling mode and the two-phase cooling mode at the same time, the liquid phase area of the fluorinated liquid in the cabinet enters the single-phase circulation loop, the gas phase area of the fluorinated liquid enters the two-phase circulation loop, and the plate heat exchanger 4 and the microchannel condensation heat exchanger 3 are both used to cool the data center cabinet 2, to ensure that the system has extremely high cooling efficiency to cope with the high heat flux of the server under ultra-high load and the extreme working environment of the server.

Figure 2:
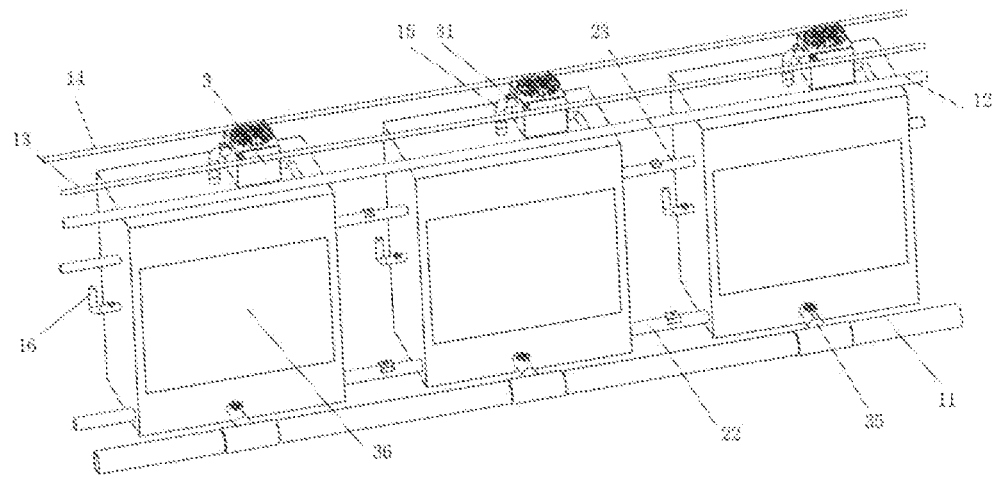
FIG. 2 is a diagram of a data center cabinet array.
Figure 3:
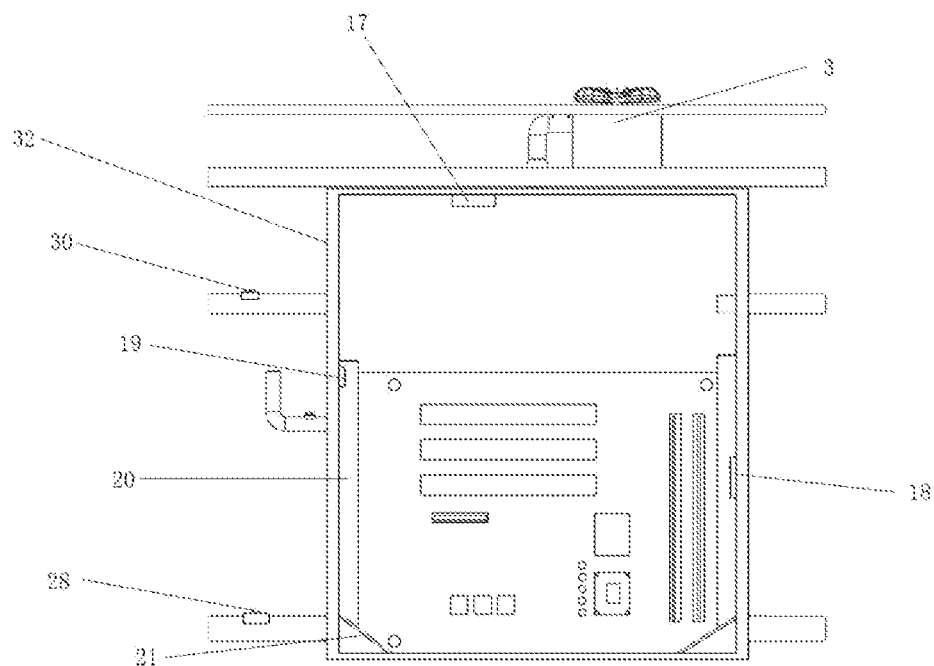
FIG. 3 is an internal sectional view of a single data center cabinet.
Figure 4:
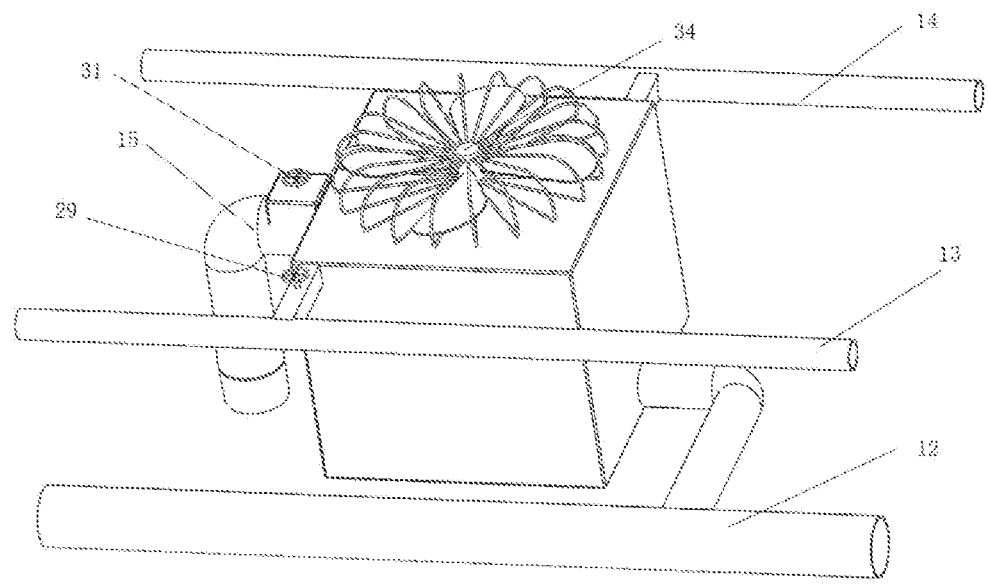
FIG. 4 is a diagram of a heat sink at a top of a data center cabinet.
Figure 5:
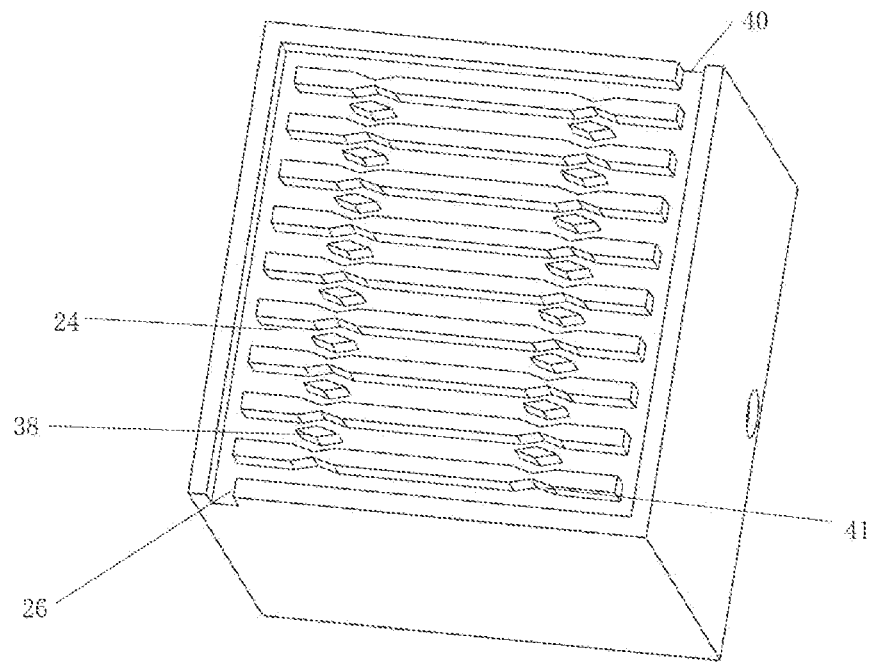
FIG. 5 is a diagram of a microchannel with micro-cooling columns.
Figure 6:
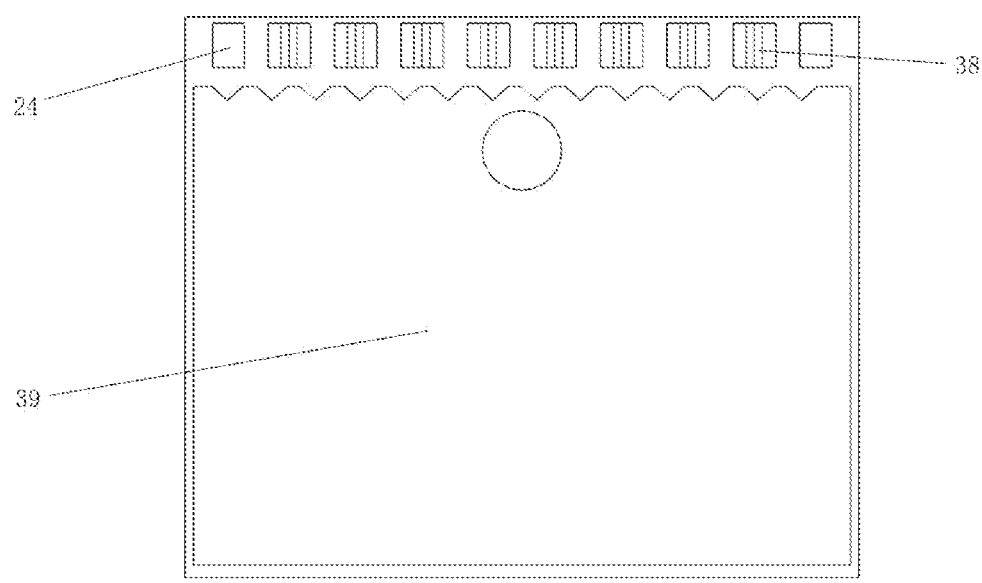
FIG. 6 is a left sectional view of a microchannel condensation heat exchanger.
Figure 7:
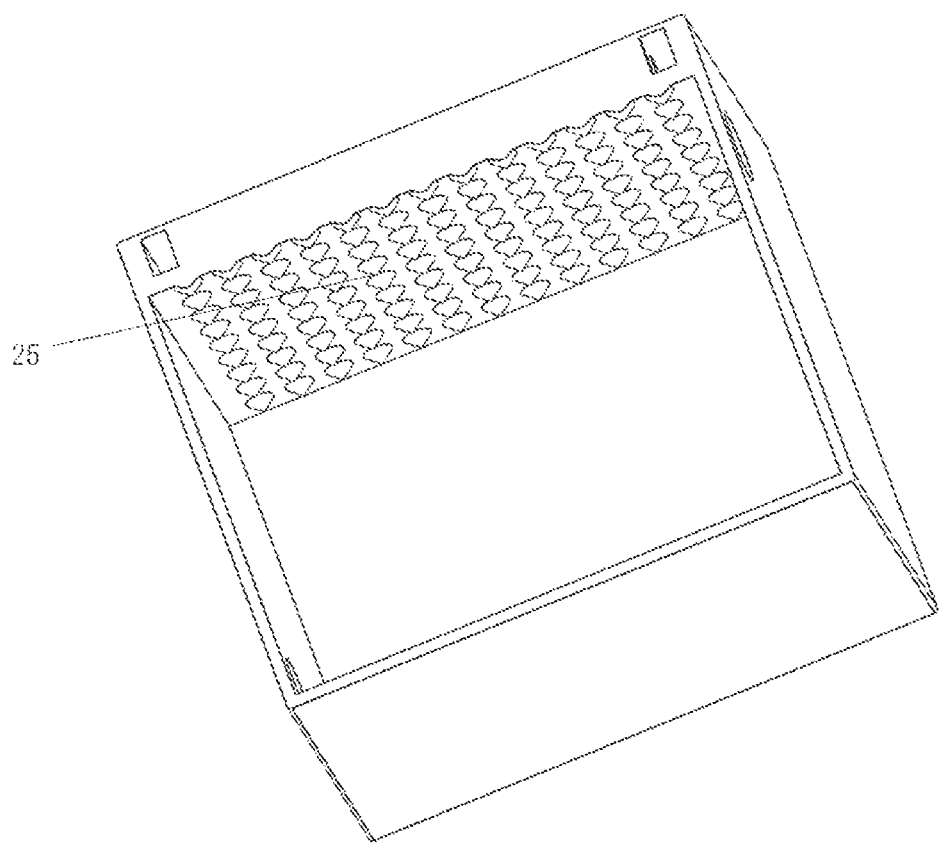
FIG. 7 is an internal sectional view of a microchannel condensation heat exchanger.

As shown in FIGS. 2 and 3, the blade server 9 is fixed at a bottom of a server cabinet housing 32 via a blade server fixing slide rail 20 and a blade server fixing baffle 21, and is immersed in the fluorinated liquid 10. The blade server fixing slide rail 20 facilitates the disassembly and maintenance of the blade server 9, and there is enough gas space above the server cabinet housing 32 for phase change of the fluorinated liquid 10, to ensure that the air pressure will not change drastically. The temperature sensor 18 is attached to the server cabinet housing 32 near a central heating unit of the blade server 9, and the liquid level of the fluorinated liquid 10 should be maintained with an appropriate reserve to account for the liquid level drop caused by the phase change of the fluorinated liquid when the system works in the two-phase circulation loop, and this liquid level should be recorded as a safe liquid level. The liquid level sensor 19 is attached to the server cabinet housing 32 at a level flush with the liquid level of the fluorinated liquid 10, and the air pressure sensor 17 is attached to a top of the server cabinet housing 32 near the fluorinated liquid vapor outlet pipeline 15. Further, a transparent window 36 is formed in the server cabinet housing 32 for observing the working condition of the blade server 9 inside and checking the adequacy of the fluorinated liquid 10 remaining. The microchannel condensation heat exchanger 3 is located above the data center cabinet 2, and they are connected via the fluorinated liquid vapor outlet pipeline 15, which is controlled by the fluorinated liquid vapor pressure relief valve 31, The cooling water inlet pipeline 13 and the cooling water outlet pipeline 14 are respectively connected with a microchannel cooling water inlet 26 and a microchannel cooling water outlet 40, and the fluorinated liquid vapor outlet pipeline 15 and the condensed fluorinated liquid return pipeline 12 are connected with the condensation chamber 39 inside the microchannel condensation heat exchanger 3. Each data center cabinet 2 and the fluorinated liquid storage tank 6 are cascaded by the cabinet communication liquid pipeline 22 and the cabinet communication gas manifold 23 to ensure the air pressure and liquid level balance among the cabinets. When the liquid level sensor 19 detects that the fluorinated liquid level drops below the safe level, the fluorinated liquid in the cabinet can be replenished by filling the fluorinated liquid storage tank 6. It is worth noting that when the system fails, the connection between the cabinets can be disconnected by closing a cabinet communication liquid pipeline valve 28 and a cabinet communication gas pipeline valve 30, and a drainage pipeline of each cabinet can be inspected separately. Each server cabinet also has a standby cabinet maintenance pipeline 16 to ensure sufficient fluorinated liquid in the cabinet and drainage maintenance in the case of disconnection.

As shown in FIGS. 4, 5, 6, and 7, the upper part of the microchannel condensation heat exchanger 3 is equipped with an external back-clip fan 34, which can be selectively turned on according to the cooling demand to enhance the convective heat transfer between the air where the cabinet is located and the heat exchanger. The microchannel condensation heat exchanger 3 comprises a fluorinated liquid vapor inlet, a condensed fluorinated liquid outlet, a microchannel cooling water inlet 26, a microchannel cooling water outlet 40, and corresponding pipes. The interior of the microchannel condensation heat exchanger 3 is divided into a microchannel cold plate and a condensation chamber 39 by a partition plate, so that the fluorinated liquid 10 and the cooling water are separated and do not pollute each other. The partition plate is made of diamond with high thermal conductivity, with a side close to the condensation chamber 39 being covered with a super-hydrophobic copper nano-cone structure 25. When the two-phase circulation loop of the system is started, the cooling water is pumped to the microchannel cooling water inlet 26 by the first cooling water drive pump 33, then the cooling water is diverted to each microchannel heat sink 24 as a cold source for convective heat exchange with high-temperature fluorinated liquid vapor, and two rhombic micro-cooling columns 38 are introduced into each microchannel to increase the heat exchange area inside the microchannel; and correspondingly, a microchannel wall surface is also engraved with rhombic grooves 41, to ensure that the cooling water flow rate will not be excessively lost due to the cooling columns, which improves cooling efficiency and cooling stability to a certain extent. Under the control of the air pressure sensor 17 and the temperature sensor 18, the flow rate of cooling water flowing into the microchannel heat sink 24 and the fluorinated liquid vapor flow rate are dynamically regulated by a cooling capacity control valve 29 and the fluorinated liquid vapor pressure relief valve 31, to ensure the best cooling efficiency and the reasonable distribution of the cooling capacity across the cabinets. Moreover, the super-hydrophobic copper nano-cone structure 25 can realize the fusion and removal of condensed liquid droplets on a small scale, while the micro-nano structure can increase the nucleation density and separation frequency of condensed liquid, thus achieving a significant improvement in condensation heat transfer coefficient. Since the fluorinated liquid vapor inlet is above the fluorinated liquid outlet, the condensed fluorinated liquid is separated from a surface of the super-hydrophobic copper nano-cone structure 25 under gravity after coalesce, and flows to the fluorinated liquid storage tank 6 through the condensed fluorinated liquid return pipeline 12. The cooling water, after absorbing heat, flows from the microchannel cooling water outlet 40 into the first waste heat recovery device 5-1 through the cooling water outlet pipeline 14, and after releasing heat, flows back to the cooling water storage tank 8 under gravity.

What is claimed is:

1. An immersion dual-cycle multi-mode liquid cooling regulation system for a data center, comprising a data center cabinet array, a microchannel condensation heat exchanger, a plate heat exchanger, a first waste heat recovery device, a second waste heat recovery device, a fluorinated liquid storage tank, a second cooling water drive pump, a cooling water storage tank, a fluorinated liquid drive pump, a first cooling water drive pump, an external back-clip fan, a single-phase loop cooling water valve and a two-phase loop cooling water valve, wherein the data center cabinet array consists of a plurality of data center cabinets, the data center cabinets are connected with the plate heat exchanger through a fluorinated liquid outlet pipeline, an outlet end of the plate heat exchanger is connected with the fluorinated liquid storage tank through the fluorinated liquid drive pump and a fluorinated liquid outlet pipeline valve, an upper part of the data center cabinet is connected with the microchannel condensation heat exchanger through a fluorinated liquid vapor outlet pipeline, a middle part of the data center cabinet communicates with the fluorinated liquid storage tank, and an upper part of the fluorinated liquid storage tank communicates with the microchannel condensation heat exchanger, thereby forming a working loop of a fluorinated liquid;

an upper part of the cooling water storage tank returns to a lower part of the cooling water storage tank through the two-phase loop cooling water valve, the first cooling water drive pump, the microchannel condensation heat exchanger and the first waste heat recovery device in sequence, thereby forming a working loop of cooling water; in addition, a middle part of the cooling water storage tank returns to the cooling water storage tank through the second waste heat recovery device, the second cooling water drive pump, the plate heat exchanger and the single-phase loop cooling water valve, thereby forming a second working loop of the cooling water; and the circulation of the cooling water and the circulation of the cooling fluorinated liquid are independent of each other, solely serving the purpose of heat exchange therebetween.

2. The immersion dual-cycle multi-mode liquid cooling regulation system for a data center according to claim 1, wherein the data center cabinet array comprises a plurality of data center cabinets, fluorinated liquid cooling systems of the data center cabinets are connected in parallel to ensure the communication of all areas, a blade server is fixed inside the data center cabinets and completely immersed in the fluorinated liquid, and a liquid surface in the data center cabinet is reserved with enough space for phase change of the fluorinated liquid.

3. The immersion dual-cycle multi-mode liquid cooling regulation system for a data center according to claim 2, wherein a surface area of the data center cabinet is partially made of a transparent interface material, allowing for observation of the working condition of the blade server inside the cabinet and checking of the adequacy of the fluorinated liquid remaining; further, an air pressure sensor, a temperature sensor and a liquid level sensor are arranged inside the data center cabinet.

4. The immersion dual-cycle multi-mode liquid cooling regulation system for a data center according to claim 3, wherein the upper part of the data center cabinet is connected with the microchannel condensation heat exchanger through the fluorinated liquid vapor outlet pipeline, that is, a fluorinated liquid vapor outlet is connected with a working medium inlet of the microchannel condensation heat exchanger, and a working medium outlet of the microchannel condensation heat exchanger is connected with the fluorinated liquid storage tank, that is, fluorinated liquid vapor flows back to the fluorinated liquid storage tank after condensation and heat exchange in the microchannel condensation heat exchanger, thus forming a fluorinated liquid two-phase circulation loop; and a bottom of the data center cabinet is provided with the fluorinated liquid outlet pipeline, the fluorinated liquid outlet pipeline is connected with a condensation inlet of the plate heat exchanger, and the fluorinated liquid flows back into the fluorinated liquid storage tank under the action of the fluorinated liquid drive pump after exchanging heat with the cooling water, thus forming a fluorinated liquid single-phase circulation loop.

5. The immersion dual-cycle multi-mode liquid cooling regulation system for a data center according to claim 4, wherein the cooling water is deionized distilled water; for single-phase circulation, an electronic fluorinated liquid Fluorinert FC-3283 featuring a high boiling point, a wide liquid range, a narrow boiling range and good thermal stability is adopted as the fluorinated liquid; for two-phase circulation and a compound working mode, an electronic fluorinated liquid Novec71DA featuring a low boiling point and a wide boiling range is adopted as the fluorinated liquid; and by adjusting the opening and closing degrees of the fluorinated liquid outlet pipeline valve, a fluorinated liquid vapor pressure relief valve and a cooling capacity control valve, all cabinets within the data center cabinet array receive appropriate cooling capacity.

6. The immersion dual-cycle multi-mode liquid cooling regulation system for a data center according to claim 5, wherein the fluorinated liquid outlet pipeline is an enhanced heat transfer pipeline with an inner fin structure and has thermal conductivity; and the microchannel condensation heat exchanger is equipped with the external back-clip fan, and cooling efficiency is further improved by the convection created by the external back-clip fan.

7. The immersion dual-cycle multi-mode liquid cooling regulation system for a data center according to claim 6, wherein the microchannel condensation heat exchanger, the data center cabinet array, the fluorinated liquid storage tank and the plate heat exchanger are arranged in descending order of height.

8. An immersion dual-cycle multi-mode liquid cooling regulation method of the regulation system according to claim 1, wherein when the dual-cycle multi-mode liquid cooling regulation system only works in a single-phase circulation loop, a fluorinated liquid vapor pressure relief valve, the two-phase loop cooling water valve and the first cooling water drive pump are closed, the fluorinated liquid outlet pipeline valve is opened, and the fluorinated liquid outlet pipeline is opened; when a cold source of the whole cycle is air where the data center cabinet is located, the single-phase loop cooling water valve is closed, the system works in an environmental cooling mode, and the fluorinated liquid flows into the plate heat exchanger under gravity, and transfers heat to external air in the flowing process; when the cold source of the whole cycle is cooling water, the single-phase loop cooling water valve is opened, the system works in a single-phase cooling mode, the cooling water in the cooling water storage tank automatically flows into the plate heat exchanger under gravity, the cooling water and the fluorinated liquid exchange heat in the plate heat exchanger, and the cooling water receiving heat through the plate heat exchanger flows through the second waste heat recovery device to recover heat and then is pumped into the cooling water storage tank to complete a cooling water single-phase cooling cycle; and the fluorinated liquid outlet pipeline of the plate heat exchanger is connected with the fluorinated liquid storage tank, and the cooled fluorinated liquid is propelled by the fluorinated liquid drive pump and flows back into the fluorinated liquid storage tank to replenish the supply of fluorinated liquid in the data center cabinet.

9. An immersion dual-cycle multi-mode liquid cooling regulation method of the regulation system according to claim 1, wherein when the dual-cycle multi-mode liquid cooling regulation system only works in a two-phase circulation loop, the fluorinated liquid outlet pipeline valve, the single-phase loop cooling water valve and the second cooling water drive pump are closed, a fluorinated liquid vapor pressure relief valve and the two-phase loop cooling water valve are opened, and fluorinated liquid vapor sends the fluorinated liquid to the microchannel condensation heat exchanger through a vapor inlet due to a pressure difference; at the same time, the cooling water enters a cooling water pipeline at an upper part of the microchannel condensation heat exchanger under the action of the first cooling water drive pump and is diverted through a microchannel with rhombic micro-cooling columns inside; moreover, the fluorinated liquid vapor is liquefied and condensed at a diamond interface to release heat, liquid droplets, after absorbing heat, coalesce and flow into the cooling water storage tank under the driving of gravity through the first waste heat recovery device, and the fluorinated liquid flows back into the fluorinated liquid storage tank under gravity.

10. An immersion dual-cycle multi-mode liquid cooling regulation method of the regulation system according to claim 1, wherein when the dual-cycle multi-mode liquid cooling regulation system works in a compound cooling mode, that is, a single-phase circulation loop and a two-phase circulation loop are both enabled, the single-phase loop cooling water valve, the two-phase loop cooling water valve, a fluorinated liquid vapor pressure relief valve, the first cooling water drive pump, the second cooling water drive pump and the fluorinated liquid outlet pipeline valve are all opened, a liquid phase area of the fluorinated liquid in the cabinet enters the single-phase circulation loop, and a gas phase area of the fluorinated liquid enters the two-phase circulation loop, to achieve the highest cooling efficiency.

11. The immersion dual-cycle multi-mode liquid cooling regulation method according to claim 8, wherein the data center cabinet array comprises a plurality of data center cabinets, fluorinated liquid cooling systems of the data center cabinets are connected in parallel to ensure the communication of all areas, a blade server is fixed inside the data center cabinets and completely immersed in the fluorinated liquid, and a liquid surface in the data center cabinet is reserved with enough space for phase change of the fluorinated liquid.

12. The immersion dual-cycle multi-mode liquid cooling regulation method according to claim 11, wherein a surface area of the data center cabinet is partially made of a transparent interface material, allowing for observation of the working condition of the blade server inside the cabinet and checking of the adequacy of the fluorinated liquid remaining; further, an air pressure sensor, a temperature sensor and a liquid level sensor are arranged inside the data center cabinet.

13. The immersion dual-cycle multi-mode liquid cooling regulation method according to claim 12, wherein the upper part of the data center cabinet is connected with the microchannel condensation heat exchanger through the fluorinated liquid vapor outlet pipeline, that is, a fluorinated liquid vapor outlet is connected with a working medium inlet of the microchannel condensation heat exchanger, and a working medium outlet of the microchannel condensation heat exchanger is connected with the fluorinated liquid storage tank, that is, fluorinated liquid vapor flows back to the fluorinated liquid storage tank after condensation and heat exchange in the microchannel condensation heat exchanger, thus forming a fluorinated liquid two-phase circulation loop; and a bottom of the data center cabinet is provided with the fluorinated liquid outlet pipeline, the fluorinated liquid outlet pipeline is connected with a condensation inlet of the plate heat exchanger, and the fluorinated liquid flows back into the fluorinated liquid storage tank under the action of the fluorinated liquid drive pump after exchanging heat with the cooling water, thus forming a fluorinated liquid single-phase circulation loop.

14. The immersion dual-cycle multi-mode liquid cooling regulation method according to claim 13, wherein the cooling water is deionized distilled water; for single-phase circulation, an electronic fluorinated liquid Fluorinert FC-3283 featuring a high boiling point, a wide liquid range, a narrow boiling range and good thermal stability is adopted as the fluorinated liquid; for two-phase circulation and a compound working mode, an electronic fluorinated liquid Novec71DA featuring a low boiling point and a wide boiling range is adopted as the fluorinated liquid; and by adjusting the opening and closing degrees of the fluorinated liquid outlet pipeline valve, the fluorinated liquid vapor pressure relief valve and a cooling capacity control valve, all cabinets within the data center cabinet array receive appropriate cooling capacity.

15. The immersion dual-cycle multi-mode liquid cooling regulation method according to claim 14, wherein the fluorinated liquid outlet pipeline is an enhanced heat transfer pipeline with an inner fin structure and has thermal conductivity; and the microchannel condensation heat exchanger is equipped with the external back-clip fan, and cooling efficiency is further improved by the convection created by the external back-clip fan.

16. The immersion dual-cycle multi-mode liquid cooling regulation method according to claim 15, wherein the microchannel condensation heat exchanger, the data center cabinet array, the fluorinated liquid storage tank and the plate heat exchanger are arranged in descending order of height.

17. The immersion dual-cycle multi-mode liquid cooling regulation method according to claim 9, wherein the data center cabinet array comprises a plurality of data center cabinets, fluorinated liquid cooling systems of the data center cabinets are connected in parallel to ensure the communication of all areas, a blade server is fixed inside the data center cabinets and completely immersed in the fluorinated liquid, and a liquid surface in the data center cabinet is reserved with enough space for phase change of the fluorinated liquid.

18. The immersion dual-cycle multi-mode liquid cooling regulation method according to claim 17, wherein a surface area of the data center cabinet is partially made of a transparent interface material, allowing for observation of the working condition of the blade server inside the cabinet and checking of the adequacy of the fluorinated liquid remaining; further, an air pressure sensor, a temperature sensor and a liquid level sensor are arranged inside the data center cabinet.

19. The immersion dual-cycle multi-mode liquid cooling regulation method according to claim 18, wherein the upper part of the data center cabinet is connected with the microchannel condensation heat exchanger through the fluorinated liquid vapor outlet pipeline, that is, a fluorinated liquid vapor outlet is connected with a working medium inlet of the microchannel condensation heat exchanger, and a working medium outlet of the microchannel condensation heat exchanger is connected with the fluorinated liquid storage tank, that is, fluorinated liquid vapor flows back to the fluorinated liquid storage tank after condensation and heat exchange in the microchannel condensation heat exchanger, thus forming a fluorinated liquid two-phase circulation loop; and a bottom of the data center cabinet is provided with the fluorinated liquid outlet pipeline, the fluorinated liquid outlet pipeline is connected with a condensation inlet of the plate heat exchanger, and the fluorinated liquid flows back into the fluorinated liquid storage tank under the action of the fluorinated liquid drive pump after exchanging heat with the cooling water, thus forming a fluorinated liquid single-phase circulation loop.

20. The immersion dual-cycle multi-mode liquid cooling regulation method according to claim 19, wherein the cooling water is deionized distilled water; for single-phase circulation, an electronic fluorinated liquid Fluorinert FC-3283 featuring a high boiling point, a wide liquid range, a narrow boiling range and good thermal stability is adopted as the fluorinated liquid; for two-phase circulation and a compound working mode, an electronic fluorinated liquid Novec71DA featuring a low boiling point and a wide boiling range is adopted as the fluorinated liquid; and by adjusting the opening and closing degrees of the fluorinated liquid outlet pipeline valve, the fluorinated liquid vapor pressure relief valve and a cooling capacity control valve, all cabinets within the data center cabinet array receive appropriate cooling capacity.

* * * * *